United States Patent [19]
Henshaw

[11] Patent Number: 5,277,779
[45] Date of Patent: Jan. 11, 1994

[54] RECTANGULAR CAVITY MAGNETRON SPUTTERING VAPOR SOURCE

[76] Inventor: William F. Henshaw, 10530 Greene Dr., Lorton, Va. 22079

[21] Appl. No.: 868,222

[22] Filed: Apr. 14, 1992

[51] Int. Cl.$^5$ .............................................. C23C 14/34
[52] U.S. Cl. ........................ 204/298.21; 204/298.09; 204/298.16; 204/298.18; 204/192.12
[58] Field of Search .................. 204/192.12, 298.09, 204/298.12, 298.16, 298.18, 298.19, 298.21

[56] References Cited

U.S. PATENT DOCUMENTS

| | | | |
|---|---|---|---|
| 3,878,085 | 4/1975 | Corbani | 204/298.21 X |
| 4,031,424 | 6/1977 | Penfold et al. | 313/146 |
| 4,116,794 | 9/1978 | Penfold et al. | 204/298.21 X |
| 4,126,530 | 11/1978 | Thornton | 204/192 EC |
| 4,622,121 | 11/1986 | Wegmann et al. | 204/298.22 X |
| 4,880,515 | 11/1989 | Yoshikawa et al. | 204/298.19 X |
| 4,915,805 | 4/1990 | Rust | 204/298.17 X |
| 4,927,513 | 5/1990 | Schultheiss et al. | 204/298.2 X |
| 4,933,057 | 6/1990 | Sebastiano et al. | 204/192.12 |
| 5,069,770 | 12/1991 | Glocker | 204/298.21 X |
| 5,073,245 | 12/1991 | Hedgcoth | 204/298.21 |

Primary Examiner—Nam Nguyen
Attorney, Agent, or Firm—Burns, Doane, Swecker & Mathis

[57] ABSTRACT

In a magnetron sputtering device for high rate coating of various substrates with sputtered atoms, the sputtering occurs from the interior cavity wall composed of four individual rectangular plates and condenses onto a substrate passing axially through the cavity. Most of the atoms which do not condense on the substrate redeposit on a wall and are subsequently sputtered resulting in efficient target utilization. A few percent, depending on the length of the cavity, escape out the end and are lost to the deposition process. The magnetic field through the cavity is uniform and relatively constant such that the four rectangular targets evenly erode. The two opposing ends of the cavity are open for substrate movement through the deposition region. The magnetic field is generated by a solenoid and allows adjustment for sputtering of magnetic materials.

9 Claims, 3 Drawing Sheets

RECTANGULAR CAVITY MAGNETRON SPUTTERING VAPOR SOURCE

BACKGROUND OF THE INVENTION

1. Field of the Invention

This invention relates generally to an electrode type, magnetically enhanced, glow discharge device used in film deposition and, more particularly, to an improved magnetron sputtering device for high rate deposition onto stationary or moving substrates.

2. Description of Prior Art

Magnetron Sputtering is a well known technique for applying a film of material to a substrate. The process involves placing a "target" comprised of or coated with the material to be sputtered into a chamber containing a low pressure gas. A negative voltage is connected to the cathode creating a low pressure gas discharge between the target and a nearby anode. Gas atoms bombard the target's surface with high energy and, through momentum transfer between the incident ions and target atoms, eject (sputter) target atoms that will condense on the substrate. The process is self-sustaining because many of the incident gas ions, rather than ejecting an atom of the material to be sputtered, create a shower of electrons that collide with neutral gas atoms and create even more gas ions. The magnetic field increases the efficiency of the electrons producing more ions when parallel to the targets surface.

A variety of magnetron sputtering devices having different geometries and using magnetic fields of various shapes to direct and guide the gas discharge have been developed. The typical magnetron sputtering devices are plagued by non-uniform magnetic fields over the sputtering surface which causes a "race track" erosion pattern on the target and reduces target utilization efficiency to typically 5% to 15%. Target utilization can be increased through target design such as specifying removal of portions that would not be sputtered and/or specifying very thin targets. These approaches have resulted in efficiencies as high as 50%. Numerous other approaches have been made to increase target utilization. One approach is to move the target with respect to the magnets. Although this approach increases target utilization, it presents additional problems. Specifically, it requires motion components which are expensive and prone to breaking down. Minimizing down time is particularly important in commercial processes. Another solution in U.S. Pat. No. 5,073,245 issued to Hedgcoth is to use a cylindrical magnetron containing a slit in its wall. This approach allows planar substrates to be coated but significantly reduces the coating rate and is best applied to thin films.

SUMMARY OF THE INVENTION

The present invention is directed towards a new and different magnetron sputtering device that is suitable for commercial use in high rate deposition of thick/thin films of sputtered material onto substrates of various geometries. Unlike prior art devices, the present invention provides a magnetron sputtering device with a cathode that wears evenly during operation and without requiring any moving parts or complicated seals.

According to the invention, the magnetron is comprised of an open ended rectangular cavity formed preferably using four rectangular plates made from or coated on one side with the material to be sputtered. The four plates are assembled to form a cavity. The assembly is inserted into a rectangular solenoid which is wound to form a uniform magnetic field along the walls of the cavity. Guard windings are applied to the solenoid in order to maximize the field uniformity and maintain the field parallel to the walls along the length of the cavity. Adjusting the current through the solenoid adjusts the magnetic field strength and allows sputtering of magnetic materials. An anode is placed in proximity of the cathode and a power supply is used to apply a negative potential to the cathode in order to maintain a glow discharge between the cathode and anode.

DESCRIPTION OF THE PREFERRED EMBODIMENT

The following description is provided to enable a person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a rectangular cavity magnetron sputtering device.

Figure 1:
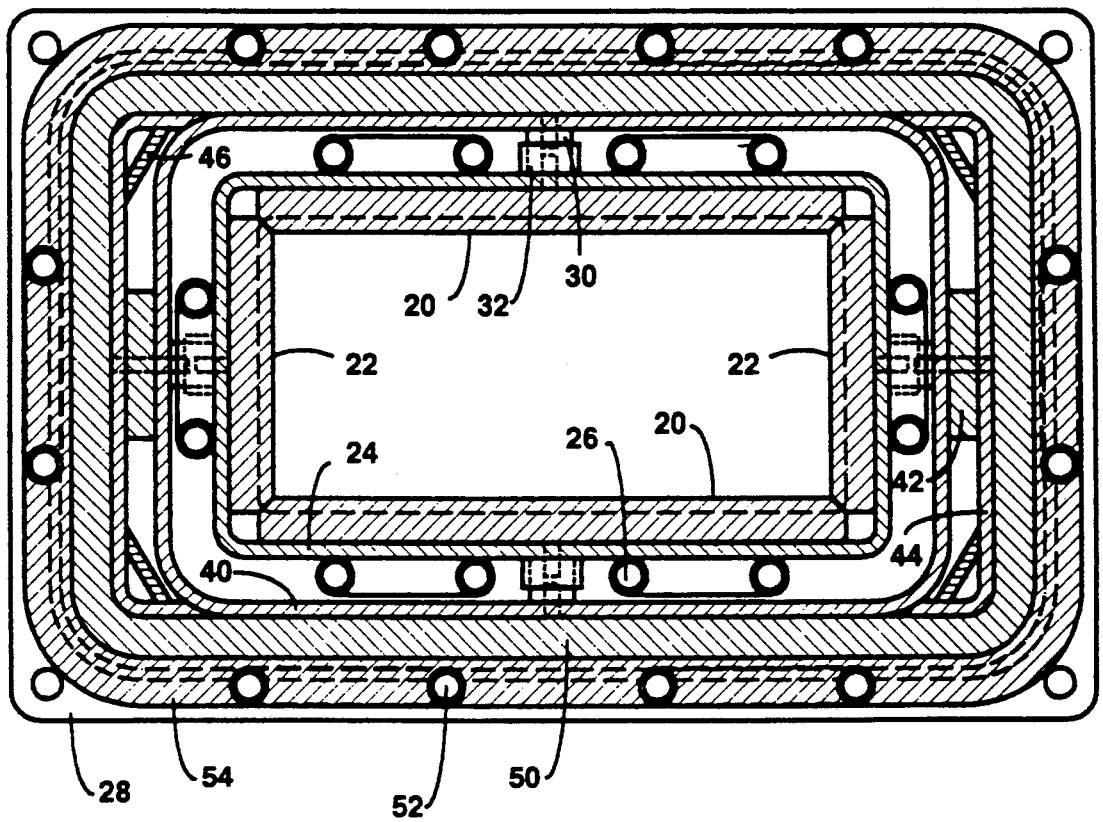
FIG. 1 is an axial cross-section of the preferred magnetron sputtering device according to the present invention.
Figure 2:
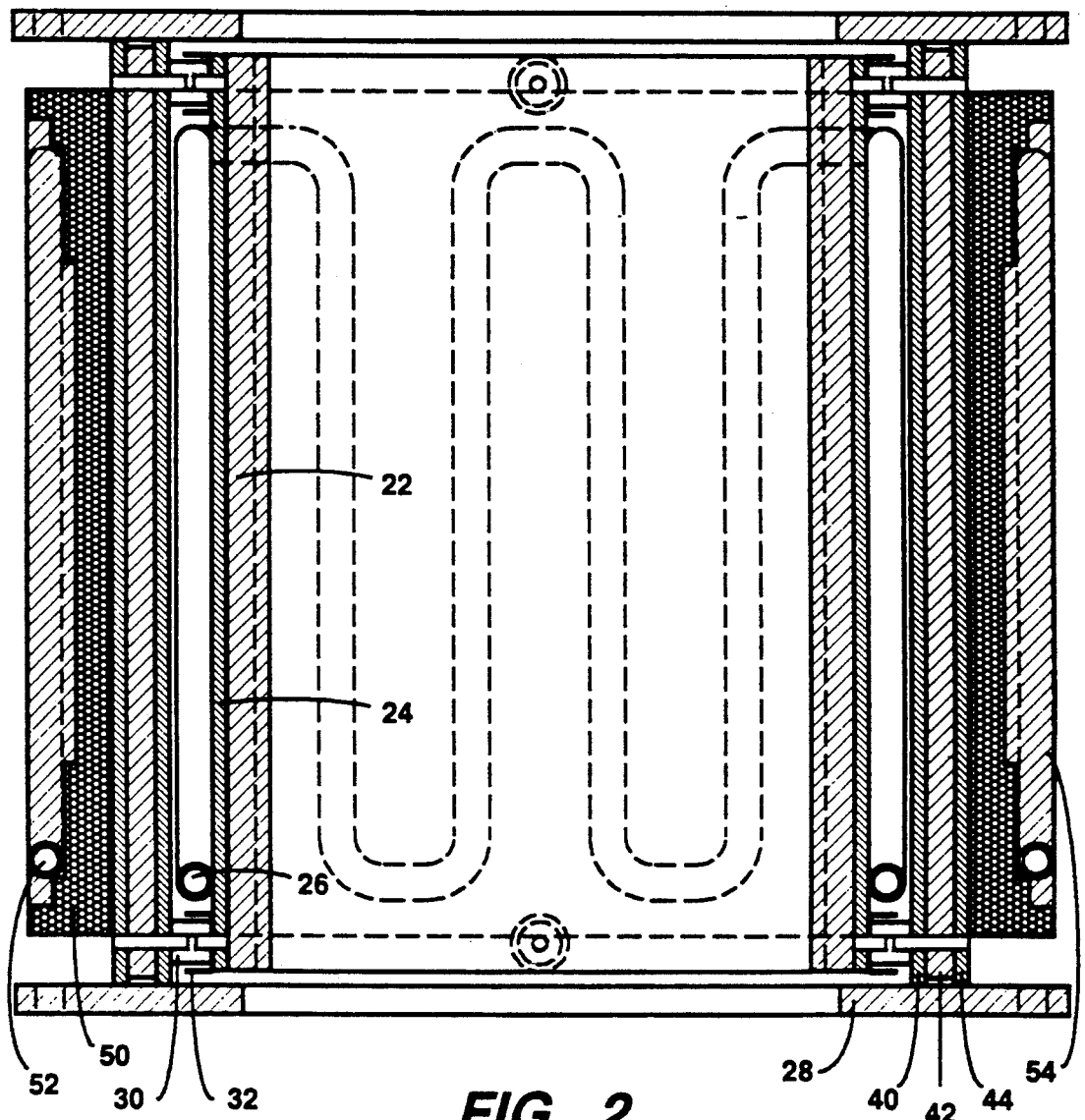
FIG. 2 is a sectional side view of the said magnetron.
Figure 3:
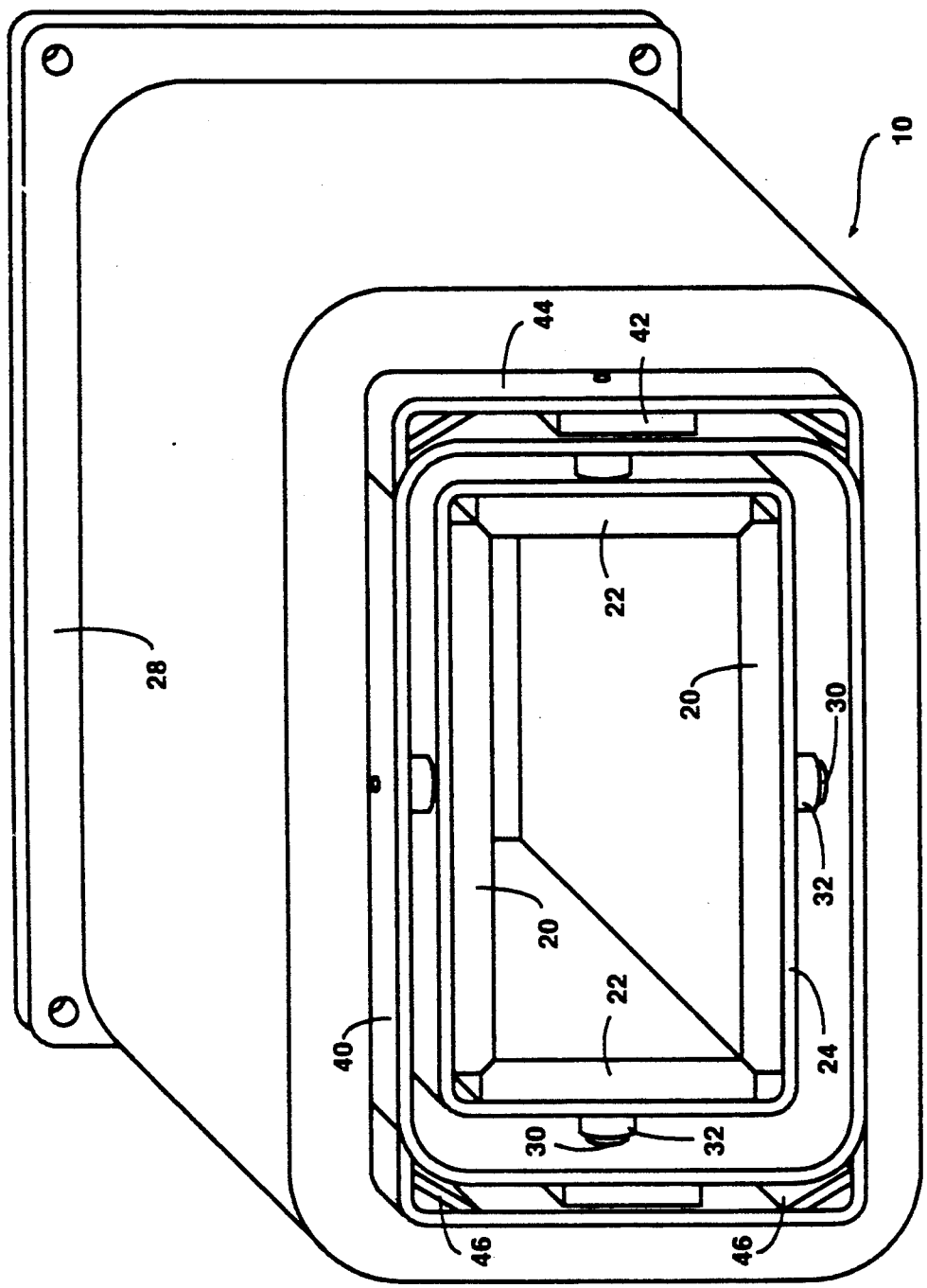
FIG. 3 is a three dimensional view of the commercialized embodiment of the present invention. The front anode has been removed for clarity.

The preferred magnetron sputtering device 10 as shown in FIGS. 1 through 3 is preferably comprised of a rectangular array of rectangular sputtering targets or cathodes 20 and 22. The cathodes 20 and 22 are matched pairs having equal lengths but two different widths which form the rectangular sputtering cavity. Alternatively, the cathode members 20 may be of the same dimensions as 22 thus forming a square cavity. As in the prior art, the cathode targets 20 and 22 are either constructed of or coated with the material to be sputtered. When a metal is to be sputtered, the device is generally operated with DC current as is known in the art. Alternatively, RF current may be used when a nonmetal is to be sputtered. The magnetron sputtering device is suitable for being disposed in a vacuum chamber in its entirety and is high vacuum compatible.

In the preferred embodiment, the cathode members 20 and 22 are removably attached to a non-magnetic metal rectangular or square enclosure 24. This multi-component construction of cathode members 20 and 22 forming the cathode cavity may be cost effectively manufactured and easily replaced. The cathodes 20 and 22 are coupled to a conventional magnetron power supply which in turn is coupled to anodes 28. The sputtering device 10 preferably includes a front anode and a rear anode 28. In FIG. 1 the front anode has been removed for clarity. Preferably the cathodes 20 and 22 are held at a relatively high -dc voltage depending upon the material to be sputtered and the anodes 28 are held at ground. Cooling of the cathode members 20 and 22 is accomplished by thermal diffusion into the enclosure 24 which in turn is cooled by a serpentine arrangement of non-magnetic metal water lines 26 metallically connected to the enclosure 24. The cathode voltage is isolated from surrounding components of the magnetron sputtering device 10 by non-metallic spacers 30. Cups 32 surround a portion of the spacers 30 to prevent the spacers from becoming coated and conductive after extensive periods of operation when sputtering metals.

The enclosure 24 is suspended in and electrically isolated from another nonmagnetic enclosure 40 by the insulating spacers 30. The enclosure 40 becomes part of the form for the solenoid 50 generating the magnetic field and is in contact with the anode 28. The solenoid 50 is coupled to a relatively low voltage dc power supply which is conventional in the art. Preferably the low voltage dc power supply is adjustable in order to adjust the current through the solenoid 50. Spacers 42 and 44 are connected to the enclosure 40 with spacer 44 acting as the remainder of the coil form. The rectangular cathode 20 and 22 has two spacers 42 on the short edge of the cavity whereas the square cathode uses four spacers 42 in which case the spacer 44 becomes another nonmagnetic enclosure. The spacers 42 serve two functions on the rectangular configuration of the sputtering device 10. The thickness of the spacer 42 allows adjustment of the magnetic field strength to make the magnetic field equal at all four cathode members since, normally the field strength would be considerably stronger on the narrowest member 22. Increasing the spacer 42 thickness rapidly decreases the magnetic field strength at the nearest cathode member 22. Secondly, the spacer 42 allows insertion of magnetic sheets 46 which serves to make the magnetic field uniform along the width of the sputtering target member. Proper sizing and positioning of the magnetic material members 46 allows adjustment from uniform magnetic field strengths on all members leading to uniform sputter erosion on all surfaces to considerable reduction in field strength and hence less sputter erosion on particular cathode members 20 or 22. The square cavity requires four spacers 42 in order to make room for insertion of the magnetic material members 46.

The spacer 44 and enclosure 40 become the form on which the solenoid 50 is wound. Alternatively, the spacer 44 becomes the form for the solenoid 50 when using a square cavity. The solenoid 50 should be wound in such a manner as to provide a uniform magnetic field along the length of the cathode members 20 and 22 with the field parallel to their surface. This requires stepped "guard bands" to be wound into the ends of the solenoid as shown in FIG. 2. In other words, there are more windings at the ends of the solenoid 50 than in the middle of the solenoid. Although, the solenoid typically consumes less than 100 watts of power, heat will build up and therefore it must be water cooled by non-magnetic metal water lines 52 also wound in a serpentine path as was the cathode cooling water lines 26. The entire solenoid 50 and water cooling lines 52 are encapsulated in a thermally conductive, high vacuum compatible epoxy 54.

While the invention has been described in its preferred embodiments, it is to be understood that the words that have been used are words of description rather than of limitation, and that changes within the purview of the present claims may be made without departing from the true scope of the invention in its broader aspects.

What is claimed is:

1. A cathode device for use in sputtering a material onto an object, comprising:
    a cavity having at least two pairs of substantially parallel sides, the cavity being formed of the material to be sputtered and having a plurality of corners;
    means for forming an electromagnetic field having flux lines of substantially uniform intensity which are substantially parallel to said pairs of substantially parallel sides of said cavity; and
    means for adjusting the electromagnetic field to allow uniform erosion of at least one side of said cavity, said means for adjusting including a plurality of metal pieces disposed at the corners of the cavity, whereby the material is sputtered onto an object disposed within the cavity.

2. A device according to claim 1 wherein said cavity includes two pairs of substantially parallel sides which form a substantially rectangular cavity.

3. A device according to claim 1 wherein said cavity includes two pairs of substantially parallel sides which form a substantially square cavity.

4. A device according to claim 1 wherein the means for forming the electromagnetic field includes a solenoid wound around said cavity.

5. A device according to claim 4 wherein said means for adjusting the electromagnetic field includes a plurality of spacers disposed between the solenoid and the substantially parallel sides of the cavity.

6. A device according to claim 4 which further includes means for adjusting the electromagnetic field provided by the solenoid.

7. A device according to claim 1 which further includes means for cooling said apparatus.

8. A device according to claim 1 wherein the object is a substrate which is displaced relative to said cavity.

9. A device according to claim 1 wherein said cathode is disposed in a vacuum chamber.

* * * * *